US007923893B2

(12) United States Patent
Oliver et al.

(10) Patent No.: US 7,923,893 B2

(45) Date of Patent: Apr. 12, 2011

(54) 3-1 MODE CAPACITIVE MEMBRANE ULTRASOUND TRANSDUCER

(75) Inventors: Nelson H. Oliver, Sunnyvale, CA (US); Sean T. Hansen, Palo Alto, CA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 1340 days.

(21) Appl. No.: 11/236,700

(22) Filed: Sep. 26, 2005

(65) Prior Publication Data

US 2007/0071272 A1 Mar. 29, 2007

(51) Int. Cl.

*H01L 41/04* (2006.01)

*H02N 1/00* (2006.01)

(52) U.S. Cl. ........................................ 310/309; 310/322

(58) Field of Classification Search .................. 310/309, 310/322, 334, 335, 800

See application file for complete search history.

(56) References Cited

U.S. PATENT DOCUMENTS

| | | | | |
|---|---|---|---|---|
| 4,039,044 | A | 8/1977 | Heil | |
| 4,056,697 | A | 11/1977 | Heil | |
| 4,107,479 | A | 8/1978 | Heil | |
| 4,160,883 | A | 7/1979 | Heil | |
| 5,438,554 | A * | 8/1995 | Seyed-Bolorforosh et al. | 367/140 |
| 6,558,330 | B1 | 5/2003 | Ayter et al. | |
| 6,753,583 | B2 * | 6/2004 | Stoffel et al. | 257/416 |
| 2002/0167249 | A1 * | 11/2002 | Fukukita | 310/334 |

OTHER PUBLICATIONS

U.S. Appl. No. 11/152,632, filed Jun. 14, 2005.
U.S. Appl. No. 11/181,520, filed Jul. 13, 2005.
U.S. Appl. No. 11/051,089, filed Feb. 4, 2005.

* cited by examiner

*Primary Examiner* — Derek J Rosenau

(57) ABSTRACT

A capacitive membrane ultrasound transducer is provided. Membranes or other microelectromechanical devices are provided in a 3-1 geometry, allowing application of an electric field substantially perpendicular to a range dimension. The membranes are on a plurality of different respective planes more parallel than perpendicular with each other, and the planes are more perpendicular than parallel with the faces of the elements or transducer.

15 Claims, 3 Drawing Sheets

FIG. 1
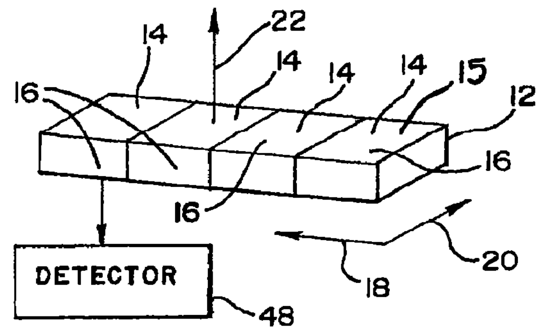
FIG. 2
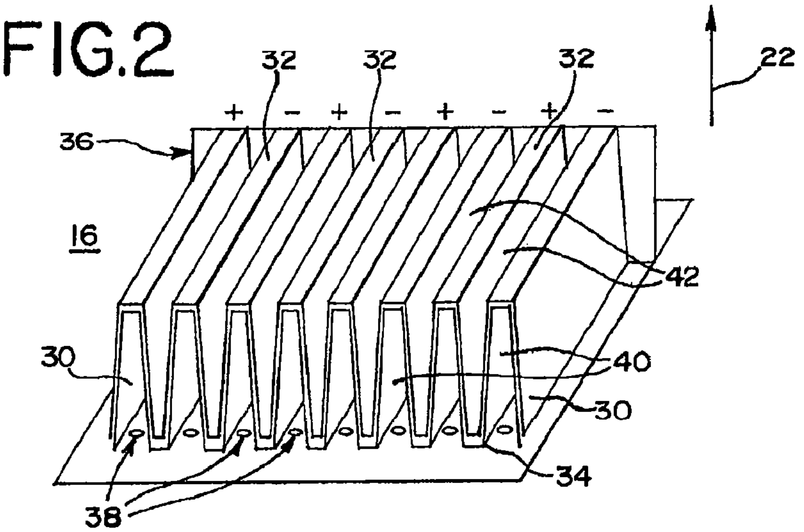
FIG. 3A
FIG. 3B
FIG. 3C
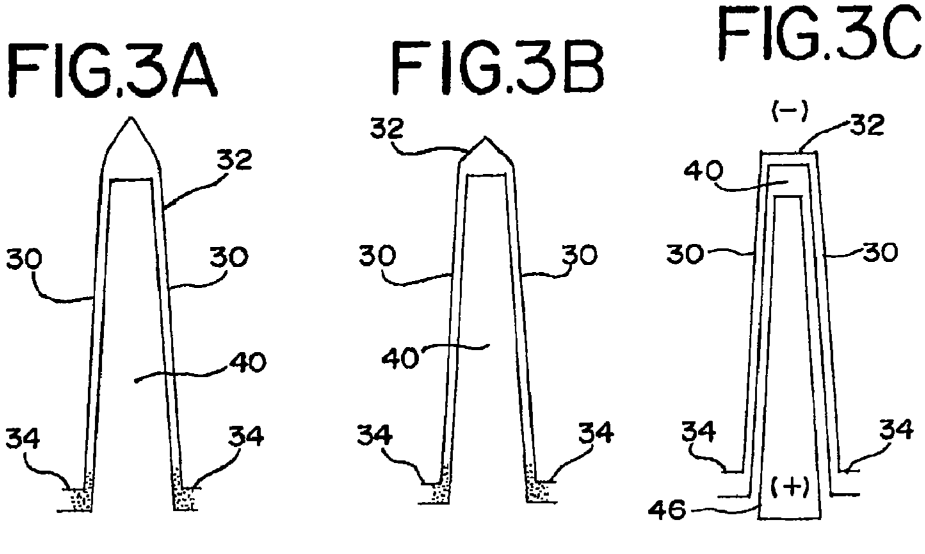

3-1 MODE CAPACITIVE MEMBRANE ULTRASOUND TRANSDUCER

BACKGROUND

The present embodiments relate to capacitive membrane ultrasound transducers (cMUT). A cMUT includes an array of elements. Each element includes a plurality of cells of microelectromechanical devices, such as membranes with an associated chamber or gap. The membranes lay in a plane along an emitting face of the element. Electrodes are provided adjacent the membrane and away from the membrane in the chamber. In response to alternating electrical potential, the membranes flex in or out of the plane, causing rarefaction and pressure waves that propagate along a range dimension orthogonal to the plane. In response to acoustic waves, the membranes flex, causing changes in electrical potential between the electrodes.

The cMUT may generate a far-field pressure of 1 MPa at 10 MHz with a peak membrane or diaphragm excursion of about 0.03 μm. Low frequency, higher power applications, such as bubble bursting or harmonic imaging, may operate with 3 MPa at 1 MHz. For these pressures, the peak membrane excursion may be around 1 μm or more. A cMUT and associated membranes may not be able to satisfy such a high-pressure requirement.

BRIEF SUMMARY

By way of introduction, the preferred embodiments described below include methods, systems and transducers for a capacitive membrane ultrasound transducer. Membranes or other microelectromechanical devices are provided in a 3-1 geometry, allowing application of an electric field substantially perpendicular to a range dimension. The membranes are on a plurality of different respective planes more parallel than perpendicular with each other, and the planes are more perpendicular than parallel with the faces of the elements or transducer.

In a first aspect, an ultrasound transducer is provided for transmitting or receiving acoustic energy at faces of elements distributed substantially along an azimuth and/or elevation dimensions. A plurality of membranes is on a plurality of different respective planes more parallel than perpendicular to each other. The planes are more perpendicular than parallel with the faces. Conductive surfaces are substantially on the membranes and/or parallel to them.

In a second aspect, a capacitive membrane ultrasound transducer has an emitting face substantially perpendicular to a range dimension. The range dimension corresponds to a down range scanning direction. An improvement includes a 3-1 mode geometry of at least one capacitive membrane.

In a third aspect, a method is provided for generating acoustic energy along a range dimension. An electric field is applied to a microelectromechanical transducer element. The electric field is applied substantially parallel with a plane substantially orthogonal to the range dimension. Acoustic energy is generated substantially along the range dimension in response to the applied electric field.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIG. 1 is a perspective view of one embodiment of an ultrasound transducer;

FIG. 2 is a graphical representation of one embodiment of part of a cMUT;

FIGS. 3A-C are exemplary partial cross-sectional views of linear ridges with different mass loading and structures;

DETAILED DESCRIPTION OF THE DRAWINGS AND PRESENTLY PREFERRED EMBODIMENTS

Figure 4:
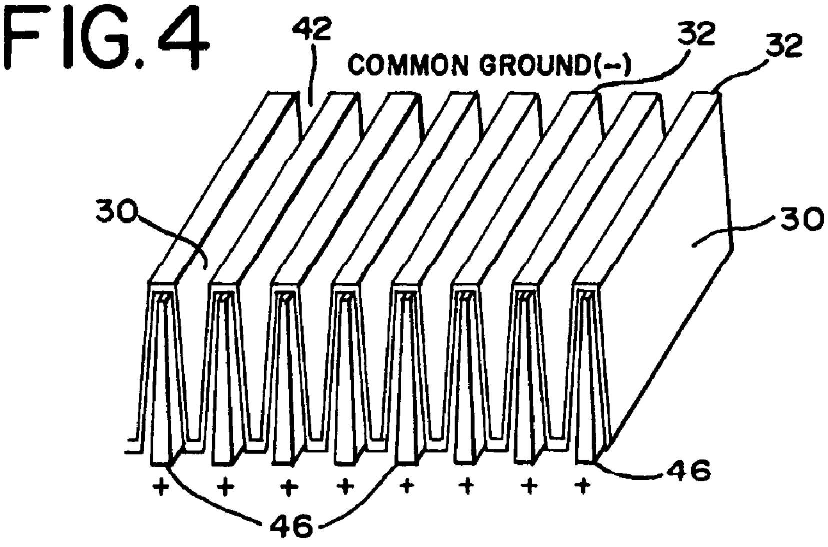
FIG. 4 is a perspective view of another embodiment of part of a cMUT.

Orienting cMUT membranes to generally face each other allows a large membrane area to concentrate total displacement into a small output area. The radiating aperture is approximately perpendicular to the vibrating diaphragms. The applied electric filed and the resulting motion may be in a plane perpendicular to the range direction, leading to down-range excursion of the surrounding medium. Large displacements and/or pressures may be generated with smaller applied voltages as compared to membranes all laying in a same plane. By folding the cMUT elements or otherwise extending the membranes into the depth of the substrate, the output is concentrated.

FIG. 1 shows one embodiment of an ultrasound transducer 12 for transmitting or receiving acoustic energy at faces 14 of elements 16 distributed substantially along azimuth 18 and/or elevation 20 dimensions. The transducer 12 is a capacitive membrane ultrasound transducer. Other microelectromechanical structures may be used, such as flexible beams. The transducer 12 is a semiconductor substrate processed using CMOS or other processes to form the membranes or other structures. Other microelectromechanical processes now known or later developed may be used. A backing block, matching layers, lens or other layers may also be provided.

The elements 16 are distributed as a one, 1.25D, 1.5D, 1.75D, 2D or other multidimensional array. Alternatively, a single element 16 is provided. The array distribution defines an emitting face substantially orthogonal or perpendicular to the range dimension 22. For curved arrays, the range dimension 22 is orthogonal to one location of the emitting face and substantially orthogonal to other locations. Acoustic energy generated by the elements 16 propagates along the range dimension 22, but also propagates substantially in the range dimension 22 by diverging as a wavefront or by purposeful scanning in a sector or Vector® format. By transmitting substantially along the range dimension 22, the down range direction is scanned for medical diagnostic ultrasound imaging, therapy, or other ultrasound purposes.

The elements 16 include microelectromechanical structures. FIG. 2 shows one embodiment of an element 16. The element 16 includes a plurality of membranes 30 along linear ridges 32, a substrate 34, an end plate 36, vents 38, chambers 40, and filler 42. Additional, different or fewer components may be provided, such as another end plate 36 further enclosing the chambers 40. Any number of membranes 30 is provided, such as one or more. Where the chambers 40 contain a vacuum, the vents 38 may not be provided.

The membranes 30 are in a 3-1 mode geometry. The membranes 30 are in a plane more parallel than orthogonal to the range dimension 22. The membranes 30 substantially face each other. The use of the term "substantially" here accounts for the membranes 30 being at an angle for guiding acoustic energy or providing a range component directly to generated acoustic energy. The membranes 30 are in different planes more parallel than perpendicular with each other. The planes are more perpendicular than parallel with the faces 14.

FIG. 2 shows the membranes 30 as sides of the linear ridges 32. Each linear ridge 30 forms two of the membranes 30 and the chamber 40. The linear ridges 32 or other microelectromechanical structure are formed using microelectromechanical processes, such as semiconductor manufacturing processes. Using CMOS, deposition, sputtering, patterning, etching or other techniques, the various components are formed, including electrical connections on or in the substrate 34. The substrate 34 is a semiconductor, such as silicon, or other now known or later developed material for forming the linear ridges 32, membranes 30 or other structure. The substrate 34 is flat or curved, such as etching the substrate and forming the microelectromechanical structures to provide a curved array of elements 16.

The linear ridges 32 may have mass loading and aperture termination to control the resonant frequency. FIGS. 3A and 3B show two different shapes of the tops of the linear ridges 32. Other shapes may be used, such as no or lesser mass loading. The shape, density and/or mass may be used to provide a resonant frequency of the membranes 30 that is at, near or just above the likely or intended frequency of operation. The thickness and other dimensions of the membranes 30 also control the acoustic or transduction characteristics. The membranes 30 are thin, such as about 1 to 0.01 micrometers, but thicker or thinner membranes 30 may be used. Uniform thickness or variation in thickness may be provided. For example, the membrane 30 is thinner at a bottom or near the substrate 34.

Each chamber 40 holds a volume of gas with one or more vents 38, or holds vacuum with no vents. The vents 38 are small or large relative to the width of the chamber 40 and vent compressed or rarefied gas away from the emitting face. The chamber 40 is thin, such as about 1 to 0.005 micrometers. Wider or thinner gaps 28 may be provided. The chamber 40 may vary in width, such as being narrower near the top or bottom, or may have a uniform width. End plates 36 at both ends of the linear ridges 32 further enclose the chamber, avoiding acoustic cross talk between elements and acoustic effects in the scanned region due to rarefaction and compression of air at the ends of the linear ridges 32. In alternative embodiments, the linear ridges 32 have enclosed ends without a plate, or have at least partially open ends.

FIGS. 3C and 4 show an alternative embodiment of the linear ridges 32. The linear ridges 32 cover and are spaced from beams 46. The beams 46 extend along the entire or only a portion of the linear ridge 32. A plurality or different beams 46 may be provided within the chamber 40. The vents 38 are provided adjacent to or through the beams 46. The beams 46 are spaced from the membranes 30 along a majority, minority, one point, one line, or over a large majority of the surface of the membranes 30. The beams 46 are spaced from the membranes 30 to avoid collapse, such as 1 to 0.5 microns.

In an alternative embodiment, the beams 46 are spaced sufficiently close to at least one location on the membrane 30, such as a center of the membrane 30, to allow collapse in response to sufficiently strong acoustic echoes. For example, the beam 46 and membrane 30 are spaced by about 0.5 to 0.005 microns. Other spacing may be used. The collapse during operation may be used to limit amplitude of analog information. Alternatively, the collapse is used to operate the membrane 30 as a digital sensor having collapsed and uncollapsed states. For example, the structures or methods described in U.S. Pat. No. 7,589,456 (Publication No. 2006/02791714 (application Ser. No. 11/152,632)), the disclosure of which is incorporated herein by reference, are used. An encoder (e.g., detector 48 of FIG. 1) connects with the beams 46 or the membranes 30. The encoder outputs digital information as a function of collapse, opening, or both collapse and opening operation of the membranes 30 in response to the acoustic echoes.

Figure 5:
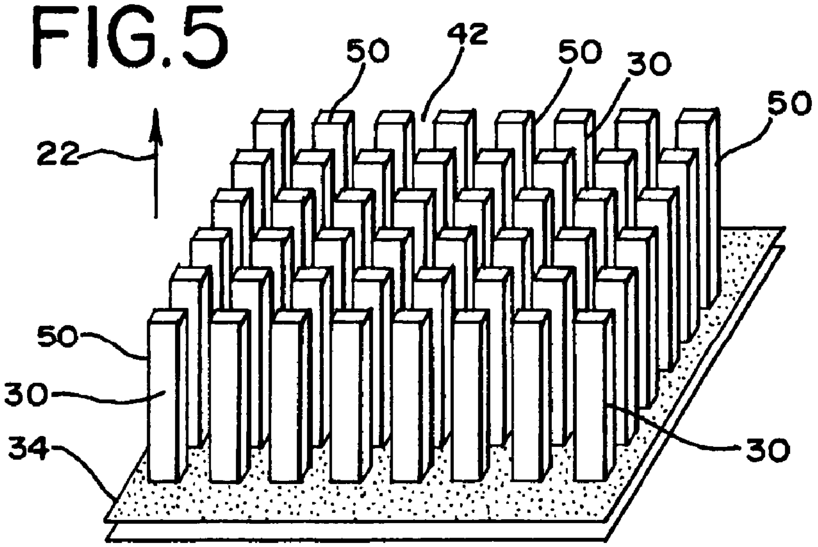
FIGS. 5 and 6 are perspectives view of other embodiments of parts of a cMUT.
Figure 6:
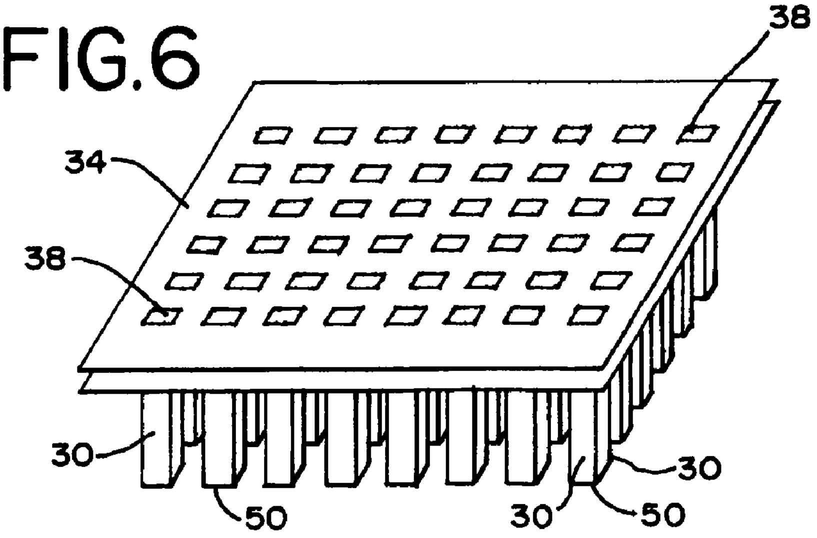
Figure 7:
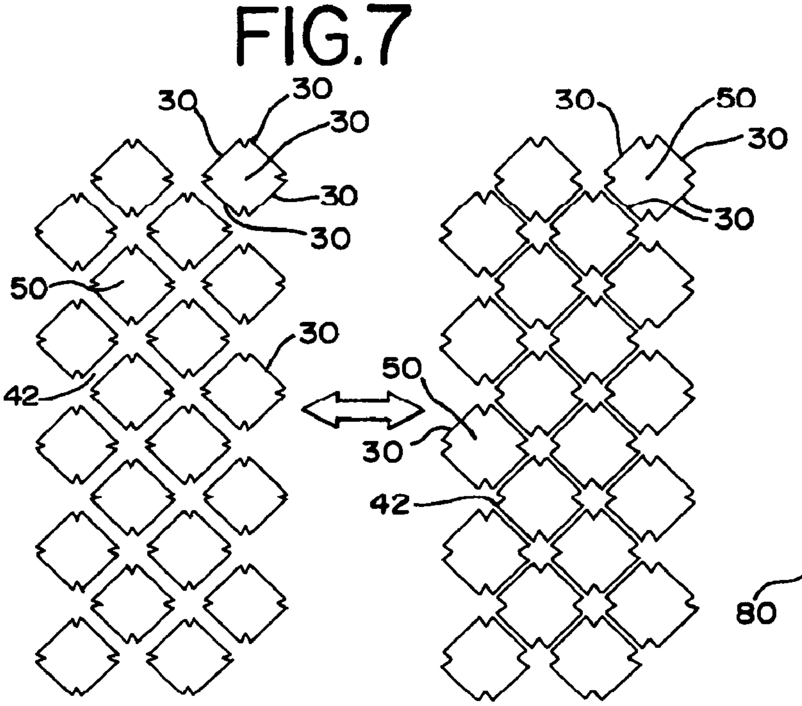
FIG. 7 is a graphical representation of 3-1 mode post membranes in compression and rarefaction positions.

FIGS. 5-7 show an alternative embodiment for a 3-1 mode membrane geometry. The membranes 30 are provided on the sides of posts 50. Each post 50 has three or more sides, providing three or more membranes 30 on a columnar structure. For example, a hexagonal post 50 provides six membranes 30. As another example, four sides with or without a notched corner to assist in membrane 30 movement are provided. FIG. 7 shows the posts 50 with notched corners. The membranes 30 move in part or entirely by expansion and contraction of the notches. Alternatively or additionally, the membranes 30 bow or flex while the corners or edges of the membranes 30 are relatively stationary. The membranes 30 may be thinner than the edges to provide more flexibility over the lesser surface area. The membrane 30 movement is in response to acoustic energy or changes in electric potential.

FIG. 5 shows the posts 50 arranged over the substrate 34 to transduce acoustic waves on the outsides of the posts 50. In an alternative embodiment shown in FIG. 6, the vents 38 allow acoustic variance from the chambers 40 within the posts 50 to be used for transduction. The substrate 34 is provided along the emitting face 14. The linear ridges 32 or other structure providing a 3-1 mode membrane geometry may be used similarly.

The filler 42 is a flexible, substantially incompressible material between the membranes 30. The filler 42 is water, water-like material, other liquid, an incompressible elastomer or other material. The filler 42 is acoustically matched to a matching layer, the object to be scanned, the membranes 30 or has another acoustic impedance. As the membranes 30 move, the incompressible material limits movement of the membranes 30 and/or moves towards another location. For example, as the membranes 30 on the linear ridges 32 of FIG. 2 move together, the filler 42 on the emitting face 14 bulges upward, contributing to generation of acoustic energy. As the membranes 30 move apart or inwards towards the chambers 40, the filler 42 moves downward. In alternative embodiments, a compressible filler 42 is provided.

The membranes 30 transduce using conductive surfaces, such as a capacitive membrane. The conductive surfaces are substantially on the membranes 30 or are parallel to them. For example, the conductive surfaces are electrodes deposited or formed on the membranes 30 and/or other structures. As another example, the conductive surfaces on the membranes 30, beams 46 or other structure are the membranes 30, beams 46 or other structure. The membranes 30 may be doped silicon to permit conduction. Combinations of doping and electrodes may be used. The substrate 34 adjacent the membranes 30 is silica or other non-conductive material to isolate the conductive linear ridges 32 and/or membranes 30.

Differences in potential between two membranes 30, a membrane 30 and a beam 46, or a membrane 30 and another structure generate mechanical displacement or acoustic waves. In FIG. 2, every other linear ridge 32 has different electrical connections and associated potential. For example, every other linear ridge 32 and the associated membranes 30 are grounded or connect to one channel, and the other linear ridges 32 and associated membranes 30 connect to a signal channel for transmit or receive operation. In FIG. 7, every other post 50 in a checker board pattern connects to different channels for different potentials. In FIGS. 4, 3C or FIG. 7 with beams 46 in the posts 50, each linear ridge 32 or post 50 has a same electric potential, such as being grounded, and each beam 46 has a same electric potential different than the electric potential of the linear ridges 32, such as being connected to a signal channel.

In one embodiment, the membranes 30 are interspersed with inflexible, substantially inflexible or flexible beams 46 or other membranes 30. Every other structure, such as every membrane 30, is grounded. On each side of the membranes 30 is a beam 46 or other membrane 30. Opposite polarity alternating electrical signals are provided to the beams 46 or other membranes 30. The opposing beams 46 act on the membrane 30 in a same direction, such as one pulling and the other pushing the membrane 30. The membrane 30 moves or flexes back and forth in response to the different potentials. A resistor sufficiently large to prevent significant change of the fixed potential on the membrane 30 connects with the membrane 30. Alternatively, an electret is used. The beams 46 and membranes 30 are substantially parallel with each other, such as slanting slightly.

Where the membranes 30 are designed for less sensitivity, but more acoustic force generation, receive operation is provided or assisted by a patterned film 15 (FIG. 1) of piezoelectric material adjacent the faces 14. For example, a film 15 of p(VDF-TFE) stretches over the cMUT 12. The patterning corresponds to the same or different elements 16 than for the transducer 12. The film transduces from acoustic waves to electrical energy. Other films may be used, such as a barrier film to act as an EMI shield and/or to increase dielectric breakdown voltage. A film may also act as a matching layer.

Figure 8:
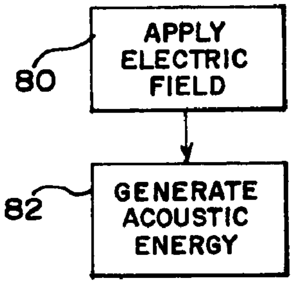
FIG. 8 is a flow chart diagram of one embodiment of a method for generating acoustic energy along a range dimension with a 3-1 mode cMUT.

FIG. 8 shows one embodiment of a method for generating acoustic energy along a range dimension. Additional, different or fewer acts may be provided. The method is implemented using one or more of the membranes 30, 3-1 mode geometries or transducers 12 described above with respect to FIGS. 1-7, but other membranes, geometries or transducers may be used. The membranes are biased, such as applying a set, fixed electric field to each or every other flexible membrane, such as with a voltage bias, or through use of electret materials. The bias causes a desired tension in the membranes.

In act 80, an electric field is applied to a microelectromechanical transducer element. The electric field is applied substantially parallel with a plane substantially orthogonal to the range dimension. The electric field extends substantially between two different conductors. The conductors are substantially orthogonal to the electric field. For example, the electric field extends between two membranes or a membrane and a beam. Since the membranes and/or beams are substantially positioned in a 3-1 mode geometry, the electric field extends along the azimuth and/or elevation dimensions and substantially perpendicular to the range dimension.

A difference in electric potential is created. An alternating potential is applied to adjacent conductive surfaces, such as adjacent doped membranes or beams. For example, one conductive surface is grounded and the voltage applied to another conductive surface is changed, such as applying an alternating bipolar or unipolar signal. As another example, different alternating signals are applied to adjacent conductors.

In one embodiment, different potentials are applied to different linear ridge or post structures each with at least two sides substantially orthogonal to the electric field. Every other linear ridge or post has a common electrical potential. The membranes associated with a given linear ridge or post have a common charge. Alternatively, the membranes are electrically isolated and may have different potentials.

In another embodiment, different potentials are applied to a beam and a membrane adjacent the beam. The membrane is substantially orthogonal to the electric field. The membranes, linear ridges or posts may have a common charge, such as the linear ridges being closer to the emitting face than the beams and having a ground potential. The alternating signal is applied to the beams.

In yet another embodiment, more than two different potentials are applied at a same time. For example, a fixed potential (e.g., ground) is applied to a membrane. Alternating potential signals with opposite polarity are applied to beams on opposite sides of the membrane.

Figure 9:
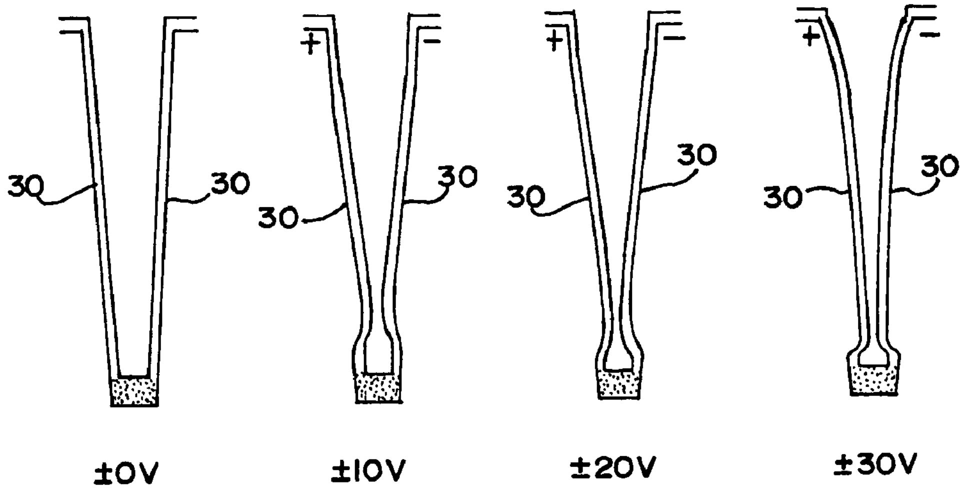
FIG. 9 is a graphical representation of membrane flexing as a function of applied voltage.

In act 82, acoustic energy is generated substantially along the range dimension in response to the coulombic forces of the applied electric field. One or more membranes flex in response to the difference in potential. The membranes flex in the 3-1 mode, such as via a displacement that is substantially parallel with the emitting face of the transducer or element. The acoustic energy reflects to or propagates substantially along the range dimension. For example, two membranes of a microelectromechanical transducer element flex away or towards each other. FIG. 9 shows one exemplary embodiment of different amounts and locations of flexing in response to different potential differentials. As the voltage varies, the membranes 30 flex towards each other, generating acoustic energy in parallel with the electric field. The acoustic energy reflects or otherwise propagates along the substantially perpendicular range dimension.

Where the separation between the membranes 30 or membrane thickness varies, the location of the flexing may be controlled. For example, the membranes 30 are narrowest further from the emitting face. In response to lesser voltages, a narrowing is provided farther from the emitting face. In response to increasing voltages, the gap generally propagates upward toward the emitting face, generating acoustic energy directly in the range dimension. The membranes 30 approximate an exponential horn or other structure. By using a horn to match the aperture to the membrane, a higher output-impedance membrane may be used. Other structures and operation may be used. Rarefaction caused by repelling the membranes 30 from each other may also generate acoustic waves in the range dimension. The incompressible material may also flex along the emitting surface, contributing to generation of the acoustic energy along the range dimension.

FIG. 8 is directed to generating acoustic energy from an applied electric field. In other embodiments, a capacitance change is generated in response to acoustic energy. One or more membranes flex in response to acoustic energy. The movement of the membranes causes an electric potential between the membranes and/or beams to change. For example, one membrane is held at a ground potential. The flexing of that membrane or another membrane causes a change in the potential of the charge on the other membranes. The variation in potential caused by the varying capacitance is an analog signal used for receive processing.

In another embodiment, the membranes or membrane and beam act as a digital acoustic sensor. Opening, closing, collapsed, or collapsing of the membrane is detected as a binary state change. The output of the microelectromechanical element is determined as a function of the digital acoustic sensor. By varying bias, membrane thickness or other properties, different membranes collapse and/or open in response to different amounts of acoustic energy. The digital output of the different membranes provides a digital signal that corresponds to the amplitude of the acoustic energy.

In yet another embodiment, receive operation is assisted or provided by a separate device, such as a different transducer or element. Another separate device is a piezoelectric film substantially in the plane of the emitting face. The film senses acoustic energy, transducing the energy into electrical signals.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. An ultrasound transducer for transmitting and/or receiving acoustic energy at faces of elements distributed substantially along azimuth and/or elevation dimensions, the transducer comprising:

a plurality of membranes on a plurality of different respective planes more parallel than perpendicular with each other, the planes being more perpendicular than parallel with the faces, each of the membranes being separated by, at least, a gas or vacuum chamber from a first adjacent one of the membranes and free of connection at a center to a second adjacent one of the membranes, each of the membranes being separate at flexible regions from the membranes of other of the planes, and each of the membranes extending between and terminating, in the respective planes, by connection to a substrate and a respective top of a respective ridge such that separate ridges formed by pairs of the membranes are separated by the substrate and are conductively isolated; and conductive surfaces substantially on the membranes.

2. The transducer of claim 1 wherein the conductive surfaces are electrodes, doped membranes, or both electrodes and doped membranes.

3. The transducer of claim 1 further comprising:

a first element comprising the plurality of membranes; and at least a second element comprising membranes;

wherein the first element and the at least a second element comprise a one dimensional or a multidimensional array of elements.

4. The transducer of claim 1 wherein the plurality of membranes comprise sides of linear ridges.

5. The transducer of claim 4 wherein each pair of membranes for each linear ridge have a same electric potential and the pair of membranes for adjacent linear ridges have different electric potential.

6. The transducer of claim 4 wherein each linear ridge covers and is spaced from a beam, each linear ridge having a same electric potential and beam having a same electric potential different than the electric potential of the linear ridges.

7. The transducer of claim 6 wherein a gap between the membranes of each linear ridge and associated beams is operable to collapse or open in response to acoustic excitation; further comprising:

an encoder connected with the beams or the membranes, the encoder operable to output digital information as a function of collapse, opening, or both collapse and opening operation of the membranes in response to the acoustic pressure.

8. The transducer of claim 1 wherein the plurality of membranes comprises sides of posts.

9. The transducer of claim 8 wherein each of the posts has three or more sides operable to flex in response to acoustic energy or changes in potential.

10. The transducer of claim 1 wherein at least pairs of the membranes cover a volume, the volume comprising (a) gas and at least one vent aperture or (b) vacuum;

further comprising:

a flexible, substantially incompressible material between the pairs of membranes.

11. The transducer of claim 1 further comprising:

a film of piezoelectric material adjacent the faces.

12. The transducer of claim 1 further comprising first and second beams on opposite sides of a first one of the membranes;

a fixed potential connection with the first membrane; and opposite polarity alternating potential connections with the first and second beams.

13. An ultrasound transducer for transmitting and/or receiving acoustic energy at faces of elements distributed substantially along azimuth and/or elevation dimensions, the transducer comprising:

a plurality of flexible membranes on a plurality of different respective planes more parallel than perpendicular with each other, the planes being more perpendicular than parallel with the faces, each of the flexible membranes physically separated by a top of a ridge from a first adjacent one of the flexible membranes and by base material from a second adjacent one of the flexible membranes, the top of the ridge being structurally different from the flexible membranes; and conductive surfaces substantially on the flexible membranes and electrically isolated from the base material such that different flexible membranes have different electrical potential.

14. The ultrasound transducer of claim 13 wherein the top of the ridge is structurally different from the flexible membranes by having a discontinuous angle in connection to the flexible membranes.

15. The ultrasound transducer of claim 13 wherein the top of the ridge is structurally different from the flexible membranes by having a different thickness.

* * * * *